United States Patent [19]

Thornton

[11] Patent Number: 4,987,468
[45] Date of Patent: Jan. 22, 1991

[54] LATERAL HETEROJUNCTION BIPOLAR TRANSISTOR (LHBT) AND SUITABILITY THEREOF AS A HETERO TRANSVERSE JUNCTION (HTJ) LASER

[75] Inventor: Robert L. Thornton, East Palo Alto, Calif.

[73] Assignee: Xerox Corporation, Stamford, Conn.

[21] Appl. No.: 208,950

[22] Filed: Jun. 17, 1988

[51] Int. Cl.$^5$ ............................................. H01L 29/72
[52] U.S. Cl. .......................................... 357/34; 357/4; 357/16; 357/17; 357/63; 357/19; 357/35; 372/45; 372/46
[58] Field of Search .................. 357/16, 17, 40, 34, 357/55, 19, 4, 34 HB, 63, 35; 372/45, 46

[56] References Cited

U.S. PATENT DOCUMENTS

| | | | |
|---|---|---|---|
| 4,511,408 | 4/1985 | Holonyak, Jr. | 148/1.5 |
| 4,594,603 | 6/1986 | Holonyak, Jr. | 357/16 |
| 4,620,210 | 10/1986 | Scavennec et al. | 357/30 |
| 4,639,275 | 1/1987 | Holonyak, Jr. | 148/1.5 |
| 4,644,381 | 2/1987 | Shieh | 357/35 |
| 4,671,830 | 6/1987 | Burnham | 148/186 |
| 4,672,414 | 6/1987 | Gabriel et al. | 357/34 |
| 4,706,255 | 11/1987 | Thornton et al. | 372/45 X |
| 4,727,403 | 2/1988 | Hida et al. | 357/16 |
| 4,727,556 | 2/1988 | Burnham et al. | 372/45 X |
| 4,727,557 | 2/1988 | Burnham et al. | 372/45 X |
| 4,728,616 | 3/1988 | Ankri et al. | 437/22 |
| 4,731,789 | 3/1988 | Thornton | 357/45 |
| 4,752,934 | 6/1988 | Fukuzawa et al. | 372/46 |
| 4,801,993 | 1/1989 | Ankri et al. | 357/16 |

OTHER PUBLICATIONS

Herbert Kroemer, "Heterostructures for Everything: Device Principle of the 1980's?", *Japanese Journal of Applied Physics*, vol. 20, Supplement 20-1, pp. 9-13, 1981.

Robert L. Thornton et al., "Monolithic Integration of a Transparent Dielectric Waveguide into an Active Laser Cavity by Impurity Induced Disordering", *Applied Physics Letters*, vol. 51(24), pp. 1983-1985, Dec. 14, 1987.

"Lateral p-n-p Transistors", Section 2.17 on Diodes and Bipolar Transistors, pp. 62-68, *Integrated Circuit Engineering-Design, Fabrication and Applications*, Arthur B. Glaser et al. Addison Wesley Publishing Company, 1987.

Herbert Kroemer, "Heterostructure Bipolar Transistors and Integrated Circuits", *Proceedings of the IEEE*, vol. 70(1), pp. 13-25, Jan., 1982.

Herbert Kroemer, "Heterostructure Devices: A Device Physicist Looks at Interfaces", *Surface Science*, vol. 132, pp. 543-576, 1983.

*Primary Examiner*—William Mintel
*Attorney, Agent, or Firm*—W. Douglas Carothers; Jonathan A. Small

[57] ABSTRACT

A lateral heterojunction bipolar transistor (LHBT) comprises emitter and/or collector regions forming a p-n heterojunctions at the emitter/base junction and at the collector/base junction with a planar base region wherein at least the emitter region is formed by employing impurity induced disordering (IID) to produce emitter or collector region of wider bandgap than the base region. The lateral heterojunction bipolar transistor of this invention can also double as a hetero transverse junction (HTJ) laser.

20 Claims, 8 Drawing Sheets

LATERAL HETEROJUNCTION BIPOLAR TRANSISTOR (LHBT) AND SUITABILITY THEREOF AS A HETERO TRANSVERSE JUNCTION (HTJ) LASER

BACKGROUND OF THE INVENTION

This invention relates to a three terminal transistor device and more particularly to a lateral heterojunction bipolar transistor (LHBT) having lateral emitter/base and collector/base heterojunctions fabricated by impurity induced disordering (IID) and also of a structure suitable as a hetero transverse junction (HTJ) laser.

Currently there is known in the art bipolar transistors which are for the most part vertical transistor structures which are junction dependent upon the epitaxial planar deposition of semiconductor layers, i.e., the p-n junctions of the device are formed at the interface of differently doped layers. Such junctions may also be formed as vertical heterojunctions via deposited heterostructure layers. Examples of such vertical transistors are found in U.S. Pat. Nos. 4,644,381 (right portion of FIG. 1 at "V"); 4,672,414; 4,728,616 and 4,620,210.

Further, efforts have been made to fabricate such transistors to have their junctions planar, i.e., positioned laterally from each other in the same layer or plane. Such an example is shown in the above mentioned U.S. Pat. No. 4,644,381 (left portion of FIG. 1 at "L") wherein a regrowth technique is employed to form a lateral heterojunction transistor having a heterojunction emitter and collector. Such a structure is complicated by a process of stopping epitaxial growth of layers B, C and D, performing a selective etching step down to a bottom deposited layer and thereafter continuing growth of layers E, F and I. Also, U.S. Pat. No. 4,639,275 to Holonyak, Jr. discloses in FIG. 5 a Schottky barrier FET which is a lateral transistor structure wherein device isolation is provided by IID regions 30 and 32.

In an article by Herbert Kroemer entitled, "Heterostructures for Everything: Device Principle of the 1980's?", *Japanese Journal of Applied Physics*, Vol. 20 (1981), Supplement 20-1, Proceedings of the 12th Conference of Solid State Devices, Tokyo, 1980, pp. 9–13, there is disclosed a lateral transistor device. In particular, on page 12 in FIG. 3 of this article, there is the suggestion of the introduction of energy bandgap variations to suppress carrier injection into portions of the base region where no injection is desired, indicating that this new important concept has powerful utility not apparently appreciated or widely recognized. FIG. 5, which is reproduced herein as FIG. 1, discloses a lateral pnp transistor 10 in I²L as an example of incorporation of this concept. Transistor 10 includes, for example, consecutively deposited layers 12, 14 and 16 comprising respectively a wide bandgap material, a narrow bandgap material and a wide bandgap material. The transistor structure is fabricated by diffusion of a p-type impurity into regions 20 and 22, the former of higher concentration. The integrity of the deposited layers is maintained.

Figure 1:
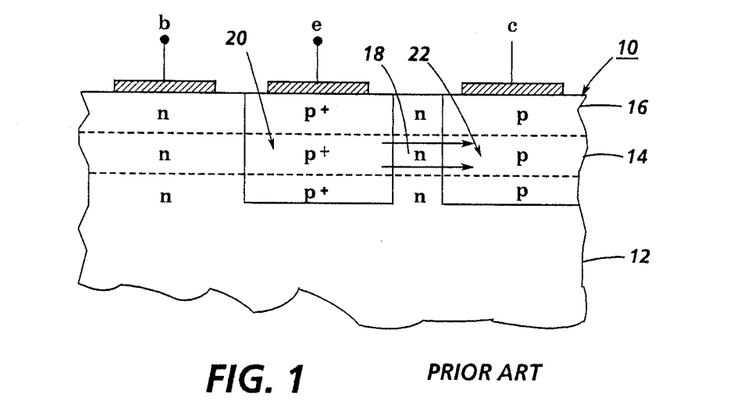
FIG. 1 schematically illustrates a side elevation of a lateral homojunction transistor of the prior art.

Kroemer recognized that a homostructure pnp design results in a poor transistor and further recognizes that heterostructure pnp design provides for confinement of injected holes in the true n base region 18 because the all narrow pnp structure formed in layer 14 is embedded between two wider bandgap layers 12 and 16. The two wider bandgap transistors formed in layers 14 and 16 are biased below their turn-on voltage, which is higher than that for the transistor of layer 14. Kroemer also recognizes that because of the small hole diffusion lengths in III/V compounds, the implementation will require submicron lengths for base region 18.

None of the foregoing transistor structures offer a lateral heterojunction bipolar transistor device with emitter and/or collector heterojunctions provided in an as-grown structure via simplified fabrication wherein the positions of the junctions as well as the selection of the base channel length can be accomplished without requiring any epitaxial regrowth technology.

Thus, it is an object of this invention to provide an improved lateral heterojunction bipolar transistor design in the III-V regime that permits the fabrication of laterally spaced heterojunctions without requiring regrowth techniques.

SUMMARY OF THE INVENTION

According to this invention, a lateral heterojunction bipolar transistor (LHBT) comprising emitter and/or collector regions forming p-n heterojunctions at the emitter/base junction and at the collector/base junction with a planar base region wherein at least the emitter region is formed by employing impurity induced disordering (IID) to produce emitter or collector region of wider bandgap than the base region. The lateral heterojunction bipolar transistor of this invention can in some designs also double as a hetero transverse junction (HTJ) laser.

The heterojunction bipolar transistor of this invention comprises a first layer doped a first conductivity type on a support, a second layer doped the first conductivity type on the first layer, a third layer doped the first conductivity type on the second layer, the first and third layers comprising a compound semiconductor having a wider bandgap than that of the second layer. A collector region is formed in the first, second and third layers doped a second conductivity type. An impurity induced disordered emitter region is also formed in the first, second and third layers of the second conductivity type in laterally spaced relation to the collector region so that the disordered emitter region comprises an enhanced layer interdiffusion alloy comprising first, second and third layers. The disordered emitter region is of a wider bandgap than the undisordered active base region of the second layer remaining between the formed collector and emitter regions and forms a heterojunction between the disordered active region and the undisordered active base region. When this transistor is constructed in a geometry to provide appropriate optical feedback and is driven into saturation by forward biasing both the emitter/base and the collector/base p-n junctions or sufficiently forward biasing one of these junctions, the carrier density in base region builds to sufficiently high levels to exhibit stimulated emission gain and bring about lasing action. Thus, the heterojunction bipolar transistor of this invention can also double as a heterostructure laser device.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 2:
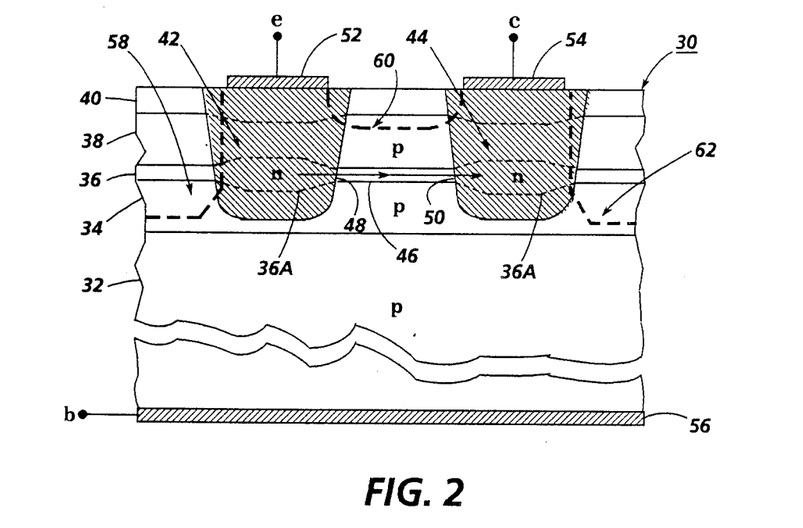
FIG. 2 schematically illustrates a side elevation of a first embodiment of a lateral heterojunction bipolar transistor of this invention.

Reference is now made to FIG. 2 wherein there is illustrated a first embodiment of this invention comprising a lateral heterojunction bipolar transistor 30. Transistor 30 comprises a semiconductor support 32 which may be a semiconductor substrate or supporting layer. Epitaxially deposited on support 32 are three semiconductor layers 34, 36 and 38 wherein layers 34 and 38, are of wider bandgap material than semiconductor layer 36. Also, layers 34, 36 and 38 are formed of the same conductivity type, shown here as p type. As an example, support 32 may be a substrate of p-GaAs, layer 34 may be p-$Ga_{1-x}Al_xAs$, layer 36 may be p-GaAs or p-$Ga_{1-y}Al_yAs$ and layer 38 may be p-$Ga_{1-z}Al_zAs$ where $x \approx z > y$. The structure is completed with cap or ohmic contact layer 40 which may be p-GaAs.

Unlike lateral bipolar transistors in the art, transistor 30 has emitter and collector regions 42 and 44 formed by impurity induced disordering (IID), which is also sometimes referred to as impurity induced layer disordering (IILD) but may be more accurately described as impurity enhanced layer interdiffusion. The IID technique is disclosed, for example, in U.S. Pat. No. 4,639,275 to Holonyak, Jr., supra, as well as in many other references in the art. In transistor 30, regions 42 and 44 are formed by IID employing a disordering impurity of n type, e.g., silicon. As shown in FIG. 2, the selectively disordered regions 42 and 44 cause at least a partial disordering or interdiffusion of the compound semiconductor materials comprising layers 32-40 within those regions. In particular, dotted areas 36A of layer 36 represents a phase front of regions converted into alloys of materials comprising layers 34, 36 and 38, e.g., $Ga_{1-A}Al_AAs$ where $A \approx z > y$. Also, because the disordering is accomplished with an n type impurity, such as Si, regions 42 and 44 will be of n-type conductivity.

The undisordered portion 46 of layer 36 between disordered emitter and collector regions 42 and 44 comprises a narrow bandgap layer or channel, e.g., of p-GaAs, bounded by wider bandgap undisordered portions of layers 34 and 38. Further, the disordered alloy regions 42 and 44, respectively, form heterojunctions 48 and 50 between emitter region 42 and base region 46 and collector region 44 and base region 46. As a result, a heterojunction npn bipolar transistor 30 is formed by regions 42, 44 and 46 having emitter/base heterojunction 48 and collector/base heterojunction 50.

As an example, base region 46 may be 100 nm thick. Narrow bandgap layer 36 or active base region 46, as well as active base region 86A of FIGS. 6 and 8, may also be sufficiently thin to form a quantum well layer and exhibit quantum size effects, e.g. 6-10 nm thick, or may be a multiple quantum well or superlattice structure of alternating thin layers of GaAs and AlAs or GaAs and GaAlAs.

Contact to regions 42, 44 and 46 is accomplished by metallization electrode 52 to emitter region 42, metallization electrode 54 to collector region 44 and metallization electrode 56 on the bottom surface of support 32 to base region 46. In order to eliminate the effect of potentially competing transistor heterojunctions at layer 36 and 40, proton implants are performed into regions 58, 60 and 62, indicated by the bold dotted lines forming these regions, to damage the crystal lattice and render these regions of higher resistance thereby rendering such competing heterojunctions of higher turn-on voltages compared to heterojunctions 48 and 50. Proton implant regions 58 and 62 are employed to isolate discrete devices on an integrated chip while proton implant region 60 deactivates the parasitic base layer formed by GaAs capping layer 40 between disordered regions 42 and 44.

Figure 3:
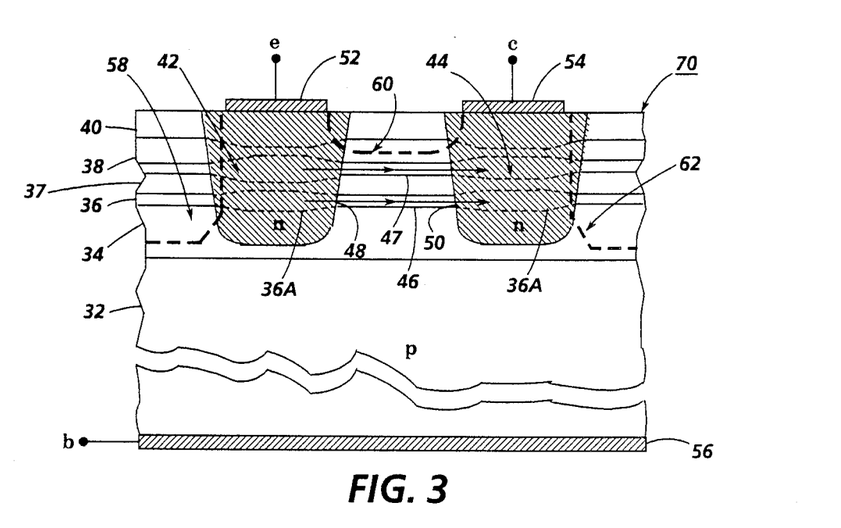
FIG. 3 schematically illustrates a side elevation of a second embodiment of a lateral heterojunction bipolar transistor of this invention.

FIG. 3 illustrates a second embodiment of this invention comprising lateral heterojunction bipolar transistor 70 which is substantially identical to the structure of transistor 30 of FIG. 2 and, therefore, like parts carry identical numerical identification since the description of these parts in FIG. 2 applies to transistor 70 of FIG. 3. The distinguishing feature of transistor 70 is the inclusion in its epitaxial growth, layers 37 and 39, e.g., respectively, comprising $Ga_{1-w}Al_wAs$ and p-GaAs or p-$Ga_{1-y}Al_yAs$, where $A \approx w \approx x \approx z > y$. After formation of disordered regions 42 and 44, there is formed a pair of spatially separated channel or base regions 46 and 47 separated by wider bandgap layer 37 having dual emitter/base heterojunctions 48 and 49 and collector/base heterojunctions 50 and 51. The employment of two injection current channels provides transistor 70 with twice the current carrying capacity.

Figure 4:
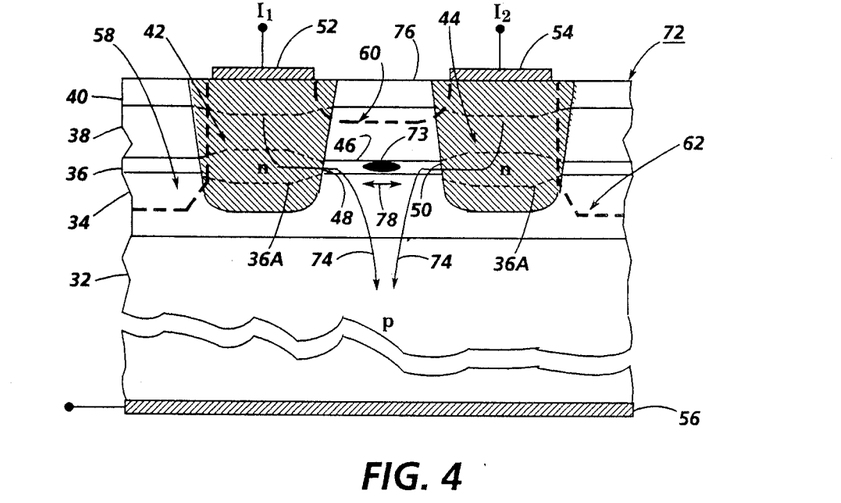
FIG. 4 schematically illustrates a side elevation of the first embodiment of this invention functioning as a hetero transverse junction laser.

An interesting aspect of the structure of LHB transistor 30 (FIG. 2) is that the same structure may be also employed to function as a buried heterostructure laser 72 under appropriate conditions of bias at electrodes 52, 54 and 56, as illustrated in FIG. 4. The structure of laser 72 is identical to transistor 30 of FIG. 2 and, therefore, like parts carry identical numerical identification since the description of these parts in FIG. 2 applies to laser 72 of FIG. 4.

Specifically, when collector p-n junction 50, which is reverse biased in the transistor operational mode of transistor 30, is forward biased, i.e., is driven into saturation by forward biasing both the emitter/base and the collector/base p-n junctions 48 and 50 or sufficiently forward biasing one of these junctions 48 or 50 via contact 52 or 54, the carrier density in base region 46 builds to sufficiently high levels to exhibit stimulated emission gain and bring about lasing action. What occurs is that in this laser operational mode, the collector p-n junction 50 as well as the emitter p-n junction 48 is forward biased repelling carriers away from junction 50 and, as a result, the transit time for carriers to cross channel base region 46 exceeds the time required for carrier recombination so that recombination occurs in active region 46 resulting in stimulated light emission. This laser structure is referred to as a hetero transverse junction (HTJ) laser 72 due to the fact that carriers are injected along fairly vertical p-n heterojunctions 48 and 50, which junctions are transverse to the plane of epitaxial layers 34-40.

Figure 11:
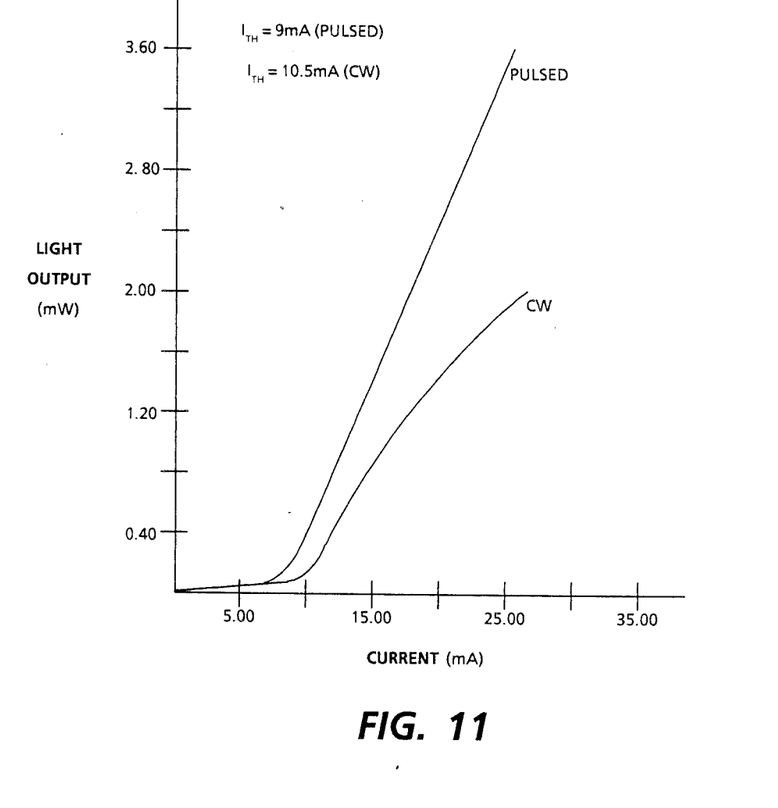
FIG. 11 shows the optical output versus pumping current characteristics for the first embodiment of this invention.

Operation of laser 72 in the saturation mode ($I_1 = I_2$ at contacts 52 and 54, and contact 56 referenced to ground) provides observed lasing action with light output or beam 73 at threshold currents as low as 6 mA, pulsed, and 10 mA, cw, at room temperature operating conditions. This threshold current value compares favorably to those routinely obtained in more conventional geometries found in present state of the art buried heterostructure lasers. FIG. 11 shows the light output versus current characteristics for a typical transistor/laser 72 and operates predominantly in a single longitudinal mode. The laser 72 tested had a pulsed threshold current, $I_{TH} = I_1 + I_2$, of 9 mA and a CW threshold current, $I_{TH} = I_1 + I_2$, of 10.5 mA.

Figure 9:
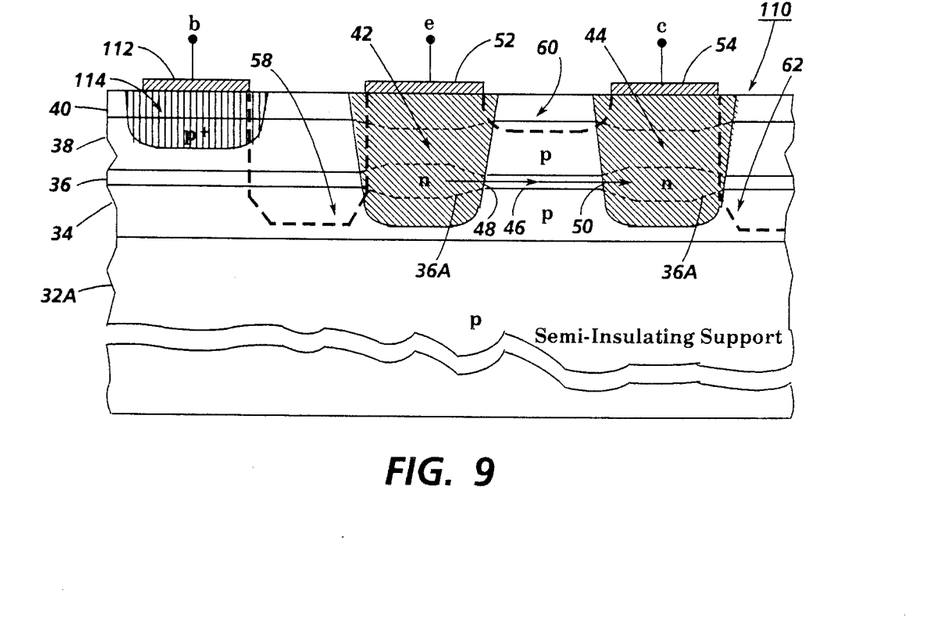
FIG. 9 schematically illustrates a side elevation of a fourth embodiment of a lateral heterojunction bipolar transistor of this invention.

The transverse injection geometry employed in laser 72 results in substantial reduction in the parasitic capacitance of the buried heterostructure. The reduced capacitance in this geometry of laser 72 would be preferred for applications involving high speed modulation and/or integration with other optoelectronic components. Also, rather than providing for current paths 74 through disordered regions 42 and 44, active region 46 and thence through layer 34 and support 32 to substrate contact 56, a potential path for contacting both sides of lasing p-n junctions 48 and 50 can be established between contacts 52 and 54 from top surface 76 of laser 72. Further, the structure of laser 72 may be modified by epitaxially growing layers 34-40 on a semi-insulating substrate 32 with a buried p-type layer employed to accomplishing base or active region 46 contact, in a manner similar to that shown in FIG. 9. Still further, beam 73 may be made to dither or scan in a reciprocating fashion, as indicated by arrow 78, by modulating the currents, $I_1$ and $I_2$, between electrodes 52 and 54. Such a modulated device would have application in a wobble or dither tracking optical disk drive. Also, drive current $I_1$ may be operated at a larger value than $I_2$ in order to steer and position beam 73 to the left in active region 46 and visa versa. In this manner, beam 73 may be positioned and focused to a spot at two different locations at different times in the far field.

Lastly, and importantly, one contact, e.g., 52, may be operated to bring about lasing operation of laser 72 while the other contact, e.g., 54, is electrically modulated to modulate the emission properties of laser 72. As an example, current $I_1$ at contact 52 may be driven to threshold operation in the mA range, e.g. 6-10 mA, and provide stimulated emission; output beam 73, with current $I_2$ at contact 54 may be operated in the nA to μA range and modulating the voltage, e.g., 0 to 1.2 volt, to modulate the depletion zone or region at p-n junction 50. Changes in the extent of the depletion region into active region 46 will vary the optical characteristics of the extended evanescent wavefront of beam 73, i.e., effect changes in the real refractive index of active region 46, which, in turn, changes the wavelength of operation of beam 73 by one or several nm. Thus, an important aspect of laser 72 is the provision of an output beam 73 capable of being operated at different times at different selected wavelengths of operation useful for optical recording and printing applications and optical communications. In this connection, laser 72 may include adjacent emitters for a laser array wherein the respective output beams of the array can be operated at different selected wavelengths with appropriate feedback circuitry to make changes in operating current $I_2$ to properly maintain a desired wavelength output of each respective emitter. Also, current $I_2$ at contact 54 may be modulated to modulate the intensity of emission from laser 72.

Reference now will be made more specifically to a method of manufacture of the lateral heterjunction bipolar transistor embodiments of this invention with reference to lateral heterojunction bipolar transistor 80 respectively shown in its initial and final stages of fabrication in FIGS. 5 and 6. The following method of fabrication is not exclusive but is representative of one successful way of forming the transistor of this invention.

Figure 5:
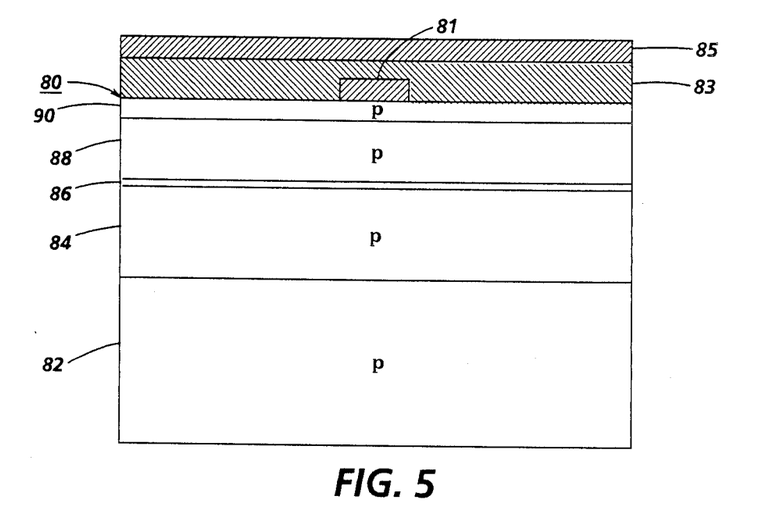
FIG. 5 illustrates an epitaxially grown structure prior to processing into the first embodiment of this invention.
Figure 6:
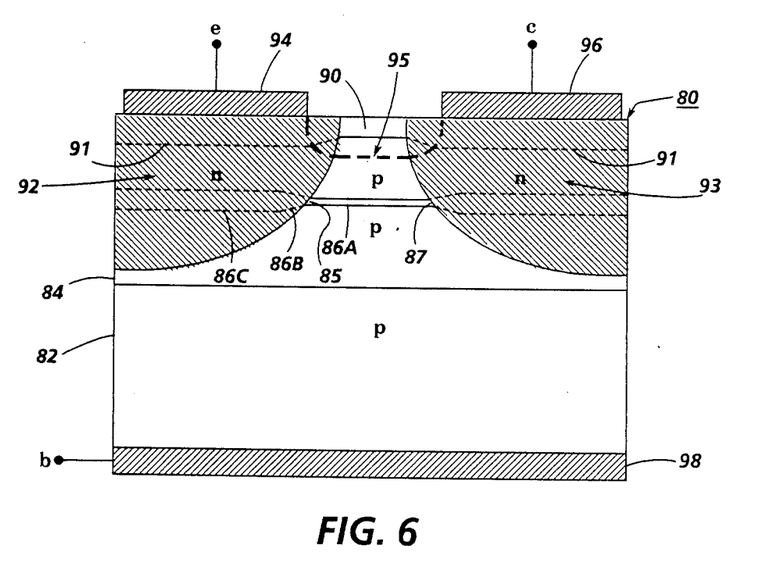
FIG. 6 is the structure shown in FIG. 5 after processing into the first embodiment of this invention.

Transistor structure 80 in FIG. 5 comprises a multilayer heterostructure grown on a p-type GaAs substrate 82. Layers 84, 86, 88 and 90 are epitaxially grown employing metal organic chemical vapor deposition (MOCVD). However, molecular beam epitaxy (MBE) may also be employed. Also, a set of buffer layers of p-GaAs and $Ga_{0.8}Al_{0.2}As$ may be grown on substrate 82 prior to the growth of epitaxial layers 84, 86, 88 and 90, but these layers are not shown in FIGS. 5 and 6 for purposes of simplicity. As a specific example, layers 84 and 88 may be $p-Ga_{0.6}Al_{0.4}As$ and base or active region 86 may be p-GaAs. Cap or ohmic contact layer 90 may be p-GaAs. Layers 84 and 88, as an example, may be 900 nm thick and active narrow bandgap region 86 may be 100 nm thick. Ohmic contact layer 90 may also be about 100 nm thick. Layers 84 and 88 need not be of the same thickness, as, for example, layer 84 may be thicker than layer 88.

Upon completion of the growth of layers 84, 86, 88 and 90, the emitter and collector of npn transistor structure 80 are formed by impurity induced disordering utilizing a deposited diffusion source of silicon. In particular, a $Si_3N_4$ mask region 81 is formed on the surface of cap layer 90 followed by the deposition of a bilayer composite source comprising a layer 83 of silicon containing a high concentration of As and a passivating layer 85 of $Si_3N_4$. The diffusion of silicon occurs from Si layer 83 into exposed regions of structure 80 not covered by mask layer 81. The diffusion is performed at 850° C. for 8 hours to reach a junction depth of 1.4 μm. During the process of the Si diffusion, the buried p-type GaAs region 86 is dispersed or interdiffused into the adjacent 40% Al layers due to IID. As a result, the lateral npn structure 80 that is formed by the Si diffusions create emitter and collector regions 92 and 93 having Al alloy compositions that do not exist in undisordered portion 86A of GaAs layer 86 existing between regions 92 and 93, which portion 86A forms the active base portion of transistor 80. The base length of base region 86A may be 1.4 μm.

Next, layers 81, 83 and 85 are removed with an etchant in preparation of contacting transistor 80. The high Si doping level remaining in Si diffused regions 92 and 93 is employed as ohmic contact to the emitter and collector of transistor 80 via emitter metallizations 94 and 96. The base contact for transistor 80 is made at metallization 98 on substrate 82. Contacts 94, 96 and 98 are Cr-Au metallizations. Proton bombardment region 95 is thereafter formed using contacts 94 and 96 as masks for the implant step. As previously indicated, the implantation in region 95 deactivates the parasitic transistor base formed by GaAs cap layer 90. Proton bombardment side regions, similar to regions 58 and 62 in FIG. 2, would also be necessary to isolate transistor 80 from adjacent integrated devices on a monolithic chip. However, transistor 80 is illustrated in FIG. 6 as a cleaved, discrete transistor device.

The forgoing technique and method of fabrication to selectively form emitter and collector regions 92 and 93 employing layers 81, 83 and 85 is detailed in patent application Ser. Nos. 07/117,593 and 07/117,596, both filed Nov. 5, 1987, assigned to the same assignee as herein and are incorporated herein by reference thereto.

Figure 10:
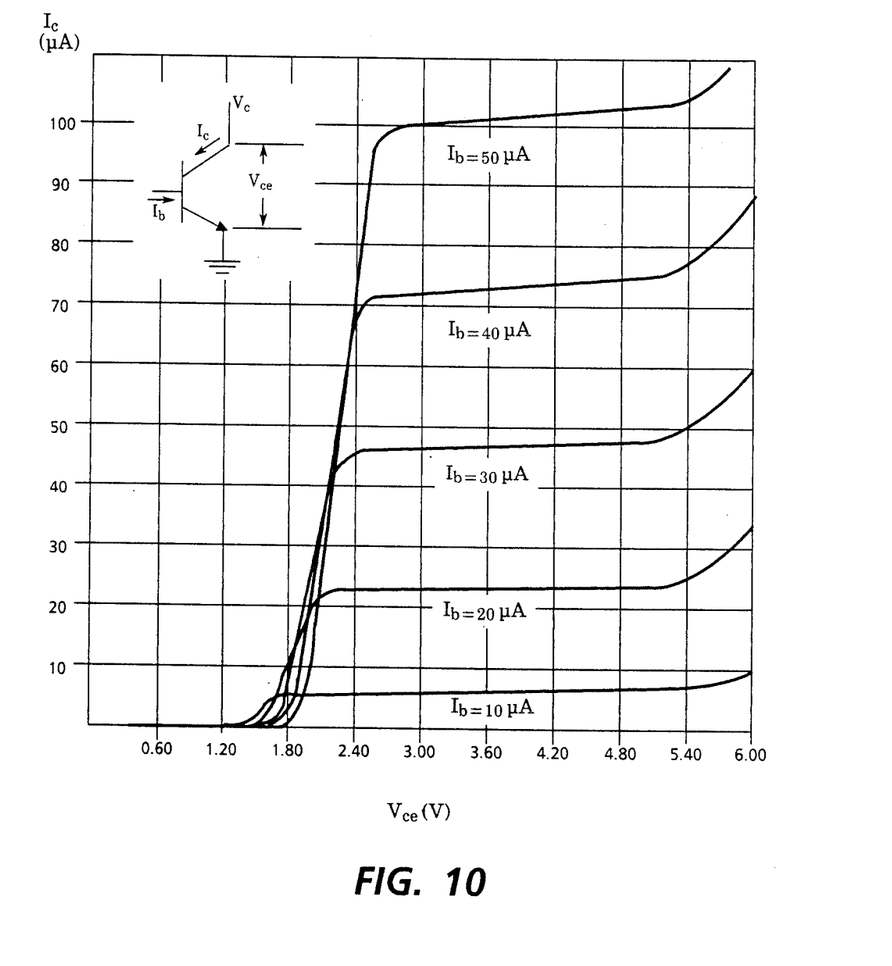
FIG. 10 shows the output characteristics for the first embodiment of this invention.

The output characteristics for npn lateral heterojunction bipolar transistor 80 are shown in FIG. 10 which demonstrate that transistor 80 exhibits transistor action with significant gain. For different values of forward bias collector to emitter voltages, $V_{ce}$, where the collector voltage, $V_c$, is zero or ground, curves for various base currents ($I_b$ = 10, 20, 30, 40 and 50 μA) shows that current gains in collector current, $I_c$, greater than unity are achieved. It can be seen from FIG. 10 that the turn-on voltage for transistor 80 is on the order of 2.4 volts. This high turn-on voltage is due to the high series resistance associated with emitter and base contacts 94 and 96. The difficulty in making ohmic contact to this structure is compounded by the fact that GaAs cap layer 90, which is introduced in order to yield an ohmic contact, does not remain a pure GaAs layer 90 after the Si disordering, as indicated by dotted lines 91. These regions of layer 90 are converted into a GaAlAs alloy of approximately 35% Al as a result of the IID process. The wider bandgap of such an alloy in ohmic contact layer 90 compounds the problem of achieving low resistance, ohmic contact. Improved ohmic contact to emitter and collector regions 92 and 93 can be provided, for example, by high dose ion implantation into the surfaces of these regions of n-type impurity, such as Si, to make these surface regions more heavily doped n-type.

Figure 7:
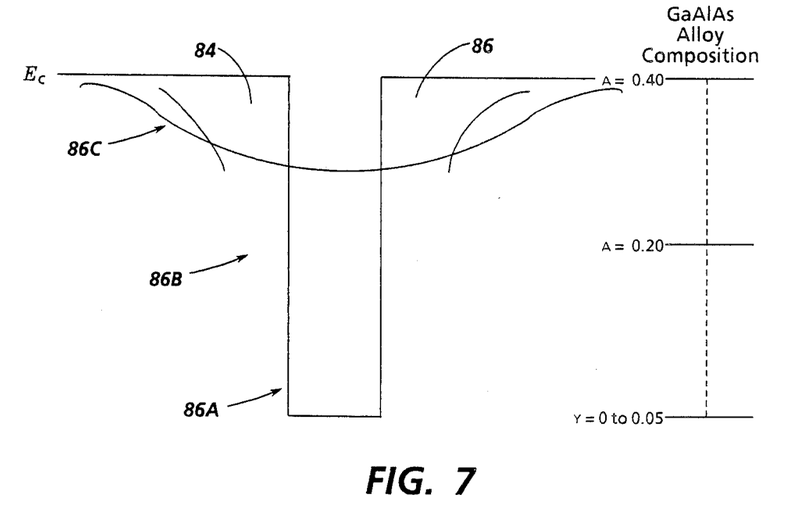
FIG. 7 is the energy conduction band profile and alloy composition variation across the base region of the structure shown in FIG. 6.

FIG. 7 shows the energy conduction band profile in the transition region of layer 86 from the undisordered active base region 86A beneath mask layer 81 through p-n junction 85 and region 86B, wherein the effects of partial disordering have gradual transitional compositional transformation to region 86C, representing the highest partial disordering due to longer exposure to and influence from the IID, since regions 86C are not originally beneath mask layer 81. Since enhanced interdiffusion has had a shorter amount of time to disorder in region 86B because of its proximity to masking of region 86A, the profile is intermediate between that of as-grown region 86A and the more fully interdiffused regions 36C. The gradual change in alloy composition from highest interdiffused regions 36C to as-grown region 36A is believed to improve the performance and injection properties of the emitter and collector regions 92 and 93 to base region 86A. The gradual transition in alloy composition change through region 86B widens the area where p-n junction 85 may actually be located, i.e., it provides a window within which this junction may be located which ensures a good heterojunction emitter/base junction.

Figure 8:
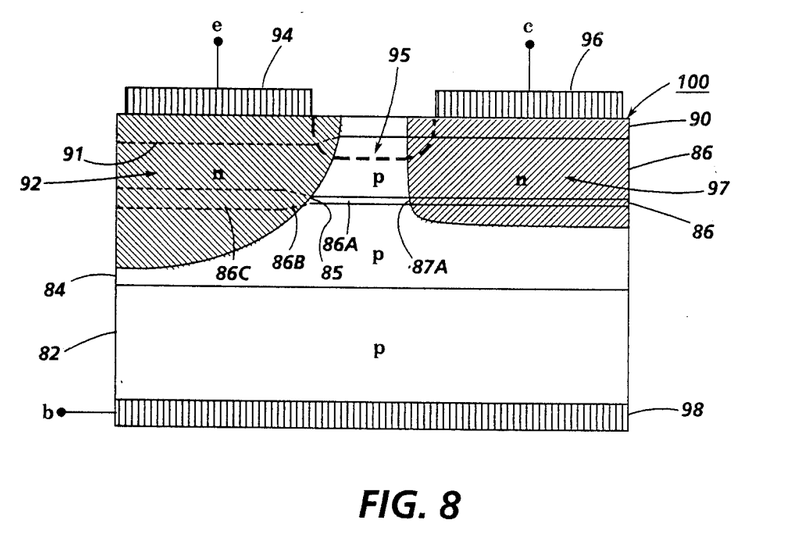
FIG. 8 schematically illustrates a side elevation of a third embodiment of a lateral heterojunction bipolar transistor of this invention.

It should be noted that while it is highly desirable to have an emitter region 92 of wider bandgap than base region 86A in order to provide a more efficient emitter/base injection of majority carriers, it is not that important for collector region 93. Thus, it is within the scope of the invention that the collector be formed by a standard Si diffusion to provide a n-type collector region 97, as shown in FIG. 8, rather than be formed as an IID region, such as disordered collector region 93. In FIG. 8, lateral heterojunction bipolar transistor 100 is substantially identical to the structure of transistor 80 of FIG. 6 and, therefore, like parts carry identical numerical identification since the description of these parts in FIG. 6 applies to transistor 100 of FIG. 8. To be noted is that the primary difference of transistor 100 is that collector region 97 comprises a n-type impurity diffusion, e.g., Si, so that the integrity of layers 84, 86, 88 and 90 in this region remain intact and are not disordered. As a result, p-n collector/base junction 87A is a p-GaAs homojunction.

Previous embodiments disclose contacting from the bottom surface of the transistor/laser. However, contacting from the top surface is also possible as illustrated in the embodiment shown in FIG. 9. Lateral heterojunction bipolar transistor 110 has a majority of the structural features of transistor 30 in FIG. 3 and, therefore, like parts carry identical numerical identification since the description of these parts in FIG. 2 applies to transistor 110 of FIG. 9. The distinguishing features, however, is that the base contact 112 and the formed base ohmic region 114 are on the same surface as emitter and collector regions 42 and 44. Ohmic region 114 is formed by performing a Zn diffusion into the surface of the structure into cap layer 40. Thus, the current path from ohmic region 114 is below and around proton implant region 58 to active base region 46. Also, support 32A is semi-insulating so that there is no electrical interference with other integrated circuit devices.

Figure 12:
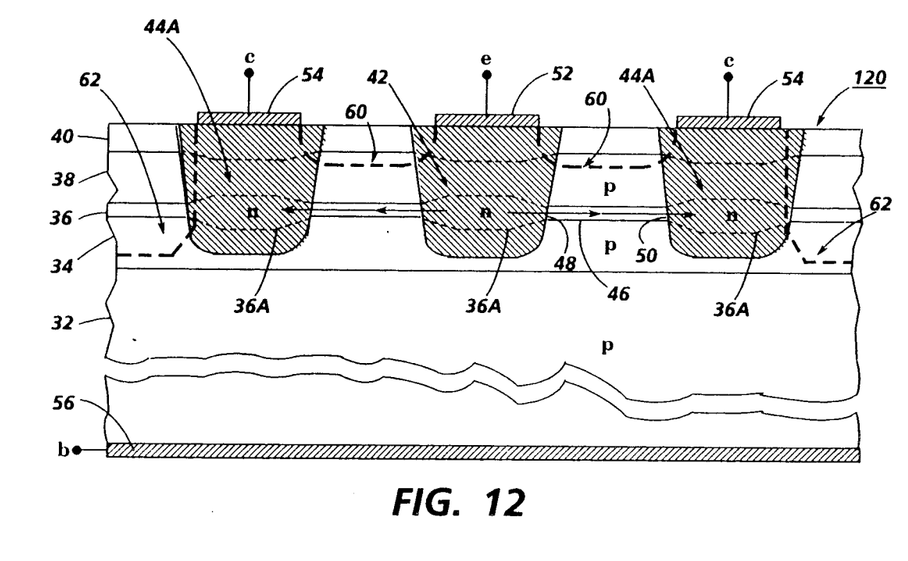
FIG. 12 shows another type of geometry for a lateral heterojunction bipolar transistor of this invention.

FIG. 12 discloses another geometry for the lateral heterojunction bipolar transistor 120 of this invention, which is not conducive for laser operation because of the lack of appropriate optical feedback capacity. Parts of transistor 120 are substantially identical to the structure of transistor 30 of FIG. 2 and, therefore, like parts carry identical numerical identification since the description of these parts in FIG. 2 applies to transistor 120 of FIG. 12. The distinguishing feature of transistor 120 is that disordered region 44A is in the form of a ring around the central emitter disordered region 42. Also, implant region 60 is in the form of a ring around emitter region 42. Thus, base region 46 is an annulus formed between central emitter region 42 and outer ring collector region 44A.

While the invention has been described in conjunction with a few specific embodiments, it is evident to those skilled in the art that many alternatives, modifications and variations will be apparent in light of the foregoing description. As an example, the opposite conductivity types may be utilized in order to fabricate a pnp transistor employing epitaxially deposited p-type layers and IID utilizing p-type impurities, such as, Zn.

Accordingly, the invention is intended to embrace all such alternatives, modifications and variations as fall within the spirit and scope of the appended claims.

What is claimed is:

1. A heterojunction bipolar transistor comprising a plurality of semiconductor layers formed on a support, one of said layers having a narrower bandgap than immediately adjacent layers thereto, an impurity induced disordered region formed in a portion of said adjacent and narrow bandgap layers, a second region formed in another portion of said adjacent and narrow bandgap layers in laterally spaced relation to said impurity induced disordered region, said disordered region of a wider bandgap than said narrow bandgap layer and forming a heterojunction between said disordered region and a portion of said narrow bandgap layer remaining between said regions, said disordered region comprising the emitter of said transistor doped a first conductivity type, said second region comprising a collector doped said first conductivity type, said narrow bandgap layer undisordered portion between said regions comprising the base of said transistor doped a second conductivity type.

2. The heterojunction bipolar transistor of claim 1 wherein said narrow bandgap layer exhibits quantum size effects.

3. The heterojunction bipolar transistor of claim 1 wherein said narrow bandgap layer comprises multiple quantum wells separated by barriers.

4. The heterojunction bipolar transistor of claim 1 comprises at least two spaced narrower bandgap layers separated by a layer of higher bandgap, said disordered region of a wider bandgap than said narrow bandgap layers and forming a heterojunction between said disordered region and a portion of said narrow bandgap layers remaining between said regions, said narrow bandgap layer undisordered portions comprising base regions of said transistor.

5. A heterojunction bipolar transistor comprising a plurality of semiconductor layers formed on a support, one of said layers having a narrower bandgap than immediately adjacent layers thereto, a first impurity induced disordered region formed in a portion of said adjacent and narrow bandgap layers, a second impurity induced disordered region formed in another portion of said adjacent and narrow bandgap layers in laterally spaced relation to said first impurity induced disordered region, said disordered regions of a wider bandgap than said narrow bandgap layer and forming a heterojunction between said disordered regions and a portion of said narrow bandgap layer remaining between said regions, one of said disordered regions comprising the emitter of said transistor doped a first conductivity type, the other of said disordered regions comprising the collector of said transistor doped said first conductivity type, said narrow bandgap layer undisordered portion comprising the base of said transistor doped a second conductivity type.

6. The heterojunction bipolar transistor of claim 5 wherein said narrow bandgap layer exhibits quantum size effects.

7. The heterojunction bipolar transistor of claim 5 wherein said narrow bandgap layer comprises multiple quantum wells separated by barriers.

8. The heterojunction bipolar transistor of claim 5 comprises at least two spaced narrower bandgap layers separated by a layer of higher bandgap, said disordered region of a wider bandgap than said narrow bandgap layers and forming a heterojunction between said disordered region and a portion of said narrow bandgap layers remaining between said regions, said narrow bandgap layer undisordered portions comprising base regions of said transistor doped a second conductivity type.

9. A heterojunction bipolar transistor comprising:
(a) a first layer doped a first conductivity type on a support,
(b) a second layer doped said first conductivity type on said first layer,
(c) a third layer doped said first conductivity type on said second layer,
(d) said first and third layers comprising a compound semiconductor having a wider bandgap than said second layer,
(e) a collector region formed in said first, second and third layers doped a second conductivity type,
(f) an impurity induced disordered region formed in said first, second and third layers of said second conductivity type in laterally spaced relation to said collector region wherein said disordered region comprises an enhanced layer interdiffusion alloy comprising said first, second and third layers,
(g) said disordered region of a wider bandgap than said second layer and forming a heterojunction between said disordered region and an undisordered portion of said second layer remaining between said regions,
(h) said disordered region comprising the emitter of said transistor and said second layer undisordered portion comprising the base of said transistor.

10. The heterojunction bipolar transistor of claim 9 wherein
(a) said collector region is an impurity induced disordered region formed in said first, second and third layers of said second conductivity type in laterally spaced relation to said disordered emitter region wherein said disordered collector region comprises an enhanced layer interdiffusion alloy comprising said first, second and third layers,
(b) said disordered collector region of a wider bandgap than said second layer and forming a heterojunction between said disordered collector region and said undisordered portion of said second layer between said regions.

11. A heterojunction bipolar transistor comprising:
(a) a first base layer of a first conductivity type on a support,
(b) a second base layer of said first conductivity type on said first base layer,
(c) a third base layer of said first conductivity type on said second base layer,
(d) said first and third base layers comprising a compound semiconductor having a wider bandgap than said second base layer,
(e) a collector region formed in said first, second and third layers doped with an impurity of a second conductivity type,
(f) at least one impurity induced disordered region formed in said first, second and third layers in laterally spaced relation to said collector region wherein said disordered region comprises an impurity enhanced layer interdiffusion alloy comprising said first, second and third layers
(g) said disordered region having a wider bandgap than said second base layer and forming a heterojunction between said disordered region and an undisordered portion of said second base layer between said regions, (h) said disordered region of said second conductivity type and comprises the emitter of said transistor and said second base layer undisordered portion comprises the base of said transistor.

12. A heterojunction bipolar transistor comprising:

(a) a first base layer of a first conductivity type on a support, (b) a second base layer of said first conductivity type on said first base layer, (c) a third base layer of said first conductivity type on said second layer, (d) said first and third base layers comprising a compound semiconductor having a wider bandgap than said second base layer, (e) a pair of impurity induced disordered regions formed in laterally spaced relation in said first, second and third layers wherein said laterally spaced disordered regions comprise an impurity enhanced layer interdiffusion alloy comprising said first, second and third layers, (f) said disordered regions having a wider bandgap than said second base layer and forming heterojunctions between said disordered regions and an undisordered portion of said second base layer remaining between said regions, (g) the impurity employed in performing said disordering of a second conductivity type, (h) said laterally spaced disordered regions comprising the emitter and collector of said transistor and said second base layer undisordered portion comprising the base of said transistor.

13. A heterojunction bipolar transistor/laser device comprising a plurality of semiconductor layers formed on a support, one of said layers having a narrower bandgap than immediately adjacent layers thereto, a first impurity induced disordered region formed in a portion of said adjacent and narrow bandgap layers, a second impurity induced disordered region formed in another portion of said adjacent and narrow bandgap layers in laterally spaced relation to said first impurity induced disordered region, said disordered regions of a wider bandgap than said narrow bandgap layer and forming a heterojunction between said disordered regions and a portion of said narrow bandgap layer remaining between said regions, one of said disordered regions comprising the emitter of said transistor doped a first conductivity type, the other of said disordered regions comprising the collector of said transistor doped said first conductivity type, said narrow bandgap layer undisordered portion comprising the base of said transistor doped a second conductivity type thereby forming p-n junctions at the interfaces of said emitter/base and collector/base, means to forward bias said emitter and reverse bias said collector to operate said device in a transistor mode and means to forward bias both said emitter and collector to operate said device in a laser mode wherein said base functions as the active region for stimulated light emission.

14. The heterjunction bipolar transistor/laser device of claim 13 wherein either of said emitter or collector is sufficiently forward biased to cause stimulated light emission in said base active region and means to electrically modulate the other of said emitter or collector to modulate the emission properties of said laser.

15. The heterojunction bipolar transistor/laser device of claim 14, said electrically modulating means to modulate the voltage at the other of said emitter or collector to selectively change the operational wavelength of said device.

16. The heterojunction bipolar transistor/laser device of claim 14, said electrically modulating means to modulate the current at the other of said emitter or collector to modulate the intensity of emission from said laser.

17. A heterojunction laser comprising a plurality of semiconductor layers formed on a support, one of said layers having a narrower bandgap than immediately adjacent layers thereto, a first impurity induced disordered region formed in a portion of said adjacent and narrow bandgap layers, a second impurity induced disordered region formed in another portion of said adjacent and narrow bandgap layers in laterally spaced relation to said first impurity induced disordered region, and a barrier region electrically isolating said disordered regions, said disordered regions of a wider bandgap than said narrow bandgap layer and forming a heterojunction between said disordered regions and a portion of said narrow bandgap layer remaining between said regions, said disordered regions doped a first conductivity type, said narrow bandgap layer undisordered portion comprising the active region of said laser and consisting of material of a second conductivity type to allow for effective injection of carriers of said second conductivity type into said active region, and means to independently forward bias at least one of said disordered regions to bring about stimulated light emission in said active region.

18. The heterojunction laser of claim 17 wherein either of said emitter or collector is sufficiently forward biased to cause stimulated light emission in said base active region and means to electrically modulate the other of said emitter or collector to modulate the emission properties of said laser.

19. The heterojunction laser of claim 18, said electrically modulating means to modulate the voltage at the other of said emitter or collector to selectively change the operational wavelength of said device.

20. The heterojunction laser of claim 18, said electrically modulating means to modulate the current at the other of said emitter or collector to modulate the intensity of emission from said laser.

* * * * *